(12) United States Patent
Sandstrom

(10) Patent No.: US 11,670,726 B2
(45) Date of Patent: Jun. 6, 2023

(54) METHOD FOR IMPROVING PHOTOVOLTAIC CELL EFFICIENCY

(71) Applicant: Robert E. Sandstrom, Longview, WA (US)

(72) Inventor: Robert E. Sandstrom, Longview, WA (US)

(*) Notice: Subject to any disclaimer, the term of this patent is extended or adjusted under 35 U.S.C. 154(b) by 641 days.

(21) Appl. No.: 15/240,587

(22) Filed: Aug. 18, 2016

(65) Prior Publication Data

US 2016/0359448 A1    Dec. 8, 2016

Related U.S. Application Data

(63) Continuation-in-part of application No. 14/806,507, filed on Jul. 22, 2015, now abandoned, which is a
(Continued)

(51) Int. Cl.
*H01L 31/0264* (2006.01)
*H01L 31/077* (2012.01)
(Continued)

(52) U.S. Cl.
CPC ........ *H01L 31/0264* (2013.01); *H01L 31/042* (2013.01); *H01L 31/077* (2013.01);
(Continued)

(58) Field of Classification Search
CPC .... H01L 31/042; H01L 51/4213; H02S 40/00
See application file for complete search history.

(56) References Cited

U.S. PATENT DOCUMENTS

| 3,143,448 A | 8/1964 | Mette et al. |
| 4,101,923 A * | 7/1978 | Gulko ................ H01L 31/0288 136/258 |

(Continued)

FOREIGN PATENT DOCUMENTS

KR    1020100051445    * 5/2010

OTHER PUBLICATIONS

Zaitsev, R.V. et al.; Functional Materials 17, No. 4 (2010); pp. 554-557 (Year: 2010).*
(Continued)

*Primary Examiner* — Jayne L Mershon
(74) *Attorney, Agent, or Firm* — Timothy E. Siegel Patent Law, PLLC; Timothy E. Siegel

(57) ABSTRACT

A method of generating electricity from light, that uses a photovoltaic array, that includes a junction between an inorganic electron-donating layer and an inorganic electron-accepting layer. The electron-donating layer includes moieties which after photon activation have unpaired electrons, and wherein some of the electrons are freed when light strikes the electron-donating layer, thereby transforming the moieties into free radicals or equivalents but many of the freed electrons recombine. Also, many of the free radicals or equivalents in the triplet state are optimally responsive to a selective magnetic field that has been determined to optimally increase the lifetime of the triplet state of the free radicals and thereby forestall recombination of the freed electrons into the free radicals. A magnetic field of substantially the optimal strength that is substantially unvarying over the electron donating layer is created as the array is being exposed to light.

16 Claims, 3 Drawing Sheets

Related U.S. Application Data continuation of application No. 14/599,879, filed on Jan. 19, 2015, now abandoned.

(60) Provisional application No. 61/966,177, filed on Feb. 18, 2014.

(51) Int. Cl.

| | | |
|---|---|---|
| *H01L 31/042* | (2014.01) | |
| *H02S 40/30* | (2014.01) | |
| *H02S 50/10* | (2014.01) | |
| *H02S 40/00* | (2014.01) | |

(52) U.S. Cl.
CPC .............. *H02S 40/00* (2013.01); *H02S 40/30* (2014.12); *H02S 50/10* (2014.12); *H10K 30/10* (2023.02); *Y02E 10/549* (2013.01)

(56) References Cited

U.S. PATENT DOCUMENTS

| | | | |
|---|---|---|---|
| 4,203,419 A | | 5/1980 | Ballinger |
| 4,355,195 A | | 10/1982 | Sansbury |
| 6,989,196 B2 | | 1/2006 | Chatterjee et al. |
| 7,109,409 B2 | | 9/2006 | Chu |
| 2005/0199279 A1 | | 9/2005 | Yoshimine et al. |
| 2006/0096633 A1* | | 5/2006 | Chu ................. B82Y 25/00 136/254 |
| 2008/0000526 A1* | | 1/2008 | Madigan ........... H01L 31/02168 136/257 |
| 2008/0217941 A1 | | 9/2008 | Chernoff et al. |
| 2009/0178709 A1 | | 7/2009 | Huber et al. |
| 2009/0314334 A1* | | 12/2009 | Saha ................. H01L 31/02008 136/249 |
| 2010/0096003 A1 | | 4/2010 | Hobbie |
| 2010/0132787 A1* | | 6/2010 | Vaananen ......... H01L 31/02021 136/256 |
| 2010/0294340 A1* | | 11/2010 | Cunningham ......... F24J 2/4614 136/251 |
| 2011/0023958 A1* | | 2/2011 | Masson ............... H01L 31/0201 136/256 |
| 2012/0097215 A1* | | 4/2012 | Vermeersch ...... H01L 31/02008 136/246 |
| 2013/0061914 A1 | | 3/2013 | Young |
| 2013/0092224 A1* | | 4/2013 | Lee ................. H01L 31/022441 136/256 |
| 2013/0098430 A1 | | 4/2013 | Naskali et al. |
| 2013/0247993 A1 | | 9/2013 | Gong |
| 2014/0166086 A1 | | 6/2014 | Marshall |
| 2015/0236180 A1 | | 8/2015 | Sandstrom |
| 2015/0349705 A1 | | 12/2015 | Sandstrom |

OTHER PUBLICATIONS

Erel, Serafettin; The effect of electric and magentic fields on the operation of a photovoltaic cell; Solar Energy Materials & Solar Cells; 71 (2002), pp. 273-280 (Year: 2002).*

Yan, Baojie, et al.; High efficiency amorphous and nanocrystalline silicon solar cells; Phys. Status Solidi A 207, No. 3, 671-677 (2010) (Year: 2010).*

Solenoid as Magnetic Field Sources; Hyperphysics; http://hyperphysics.phy-astr.gsu.edu/hbase/magnetic/solenoid.html; accessed and printed May 1, 2019 (Year: 2019).*

Definition of Electricity; Oxford Dictionaries; https://en.oxforddictionaries.com/definition/electricity; accessed and printed May 2, 2019 (Year: 2019).*

R. R. Vardanyan, U. Kerst, P. Wawer, and H. Wagemann, "Method for measurement of all recombination parameters in the base region of solar cells," in Proceeding of the 2nd World Conference and Exhibition on Photovoltaic Solar Energy Conversion, vol. I, pp. 191-193, Vienna, Austria, Jul. 1998. (Year: 1998).*

Madougou, Saïdou, et al. "IV Characteristics for Bifacial Silicon Solar Cell under a Magnetic Field." Advanced Materials Research. vol. 18. Trans Tech Publications Ltd, 2007. (Year: 2007).*

Band Theory; Encyclopaedia Britannica; published Jan. 17, 2014; accessed and printed Dec. 3, 2020; pp. 1-2; https://www.britannica.com/science/band-theory (Year: 2014).*

Van Zeghbroeck, B.; Section 2.3 Energy Bands; Chapter 2: semiconductor fundamentals; Principles of Semiconductor Devices; https://ecee.colorado.edu/~bart/book/book/chapter2/ch2_3.htm (Year: 2011).*

Kuphaldt, Tony R.; Lessons in Electric Circuits, vol. III—Semiconductors, 5th Edition; section 2.4 Band Theory of solids; pp. 47-50 (Year: 2009).*

Machine translation of KR 1020100051445; published May 17, 2010; accessed and printed Dec. 7, 2020 (Year: 2010).*

Li W., Kwok H. (2012) Conduction Mechanisms in Organic Semiconductors. In: Bhushan B. (eds) Encyclopedia of Nanotechnology. Springer, Dordrecht. https://doi.org/10.1007/978-90-481-9751-4_7 (Year: 2012).*

Fundamental Properties of Solar Cells; The University of Toledo Department of Physics and Astronomy; pp. 1-30 (Year: 2012).*

Fengshi Cai, Shixin Zhang, Shuai Zhou, Shihao Yuan, Magnetic-field enhanced photovoltaic performance of dye-sensitized TiO2 nanoparticle-based solar cells, School of Materials Science and Engineering, Tianjin University of Technology, Tianjin 300384, PR China, Key Laboratory of Display Materials and Photoelectric Devices, Tianjin University of Technology, Ministry of Education of China, Tianjin 300384, PR China, Tianjin Key Lab for Photoelectric Materials & Devices, Tianjin 300384, PR China.

Wenfeng Zhang, Ying Xu, Haitao Wang, Chenhui Xu, Shangfeng Yang, Fe3O4 nanoparticles induced magnetic field effect on efficiency enhancement of P3HT PCBM bulk heterojunction polymer solar cells, , Hefei National Laboratory for Physical Sciences at Microscale, CASKey Laboratory of Materials for Energy Conversion & Department of Materials Science and Engineering, University of Science and Technology of China,(USTC), 96 Jinzhai Road, Hefei 230026, PR China.

Ming He, Feng Qiu, Zhiqun Lin,Toward High-Performance Organic-Inorganic Hybrid Solar Cells: Bringing Conjugated Polymers and Inorganic Nanocrystals in Close Contact, School of Materials Science and Engineering, Georgia Institute of Technology, Atlanta, Georgia 30332, United States, State Key Laboratory of Molecular Engineering of Polymers, Department of Macromolecular Science, Fudan University, Shanghai 200433, China.

Shakya et al.; The effect of applied magnetic field on photocurrent generation in poly-3-hexylthiophene:[6,6]-phenyl C61-butyric acid methyl ester photovoltaic devices; J. Phys.: Condens. Matter; 20 452203; published Oct. 8, 2008; pp. 1-4.

Toong Way Yun et al.; Fabrication and morphological characterization of hybrid polymeric solar cells based on P3HT and inorganic nanocrystal blends; Sains Malaysiana; available Aug. 25, 2011 ; pp. 1-6.

Katz, Cheryl Will New Technologies Give Critical Boost to Solar Power?, Yale School of Forestry & Environmental Studies, Dec. 11, 2014.

* cited by examiner

METHOD FOR IMPROVING PHOTOVOLTAIC CELL EFFICIENCY

RELATED APPLICATIONS

This application is a continuation-in-part of U.S. application Ser. No. 14/806,507 filed on Jul. 22, 2015 which itself is a continuation of U.S. application Ser. No. 14/599,879 filed Jan. 19, 2015, which, in turn, claims priority from provisional application no. 61/966,177, filed Feb. 18, 2014, which are all incorporated by reference as if fully set forth herein.

BACKGROUND

Many different types of photo-voltaic cells have been developed, including crystalline silicon, thin film and multi-junction cells. Although these differing types of cells work along broadly similar principles, with photoactive compounds absorbing energy from photons leading to the production of electric power, the specifics vary broadly. In terms of commercialization, as of 2014, crystalline silicone cells were dominant.

Another type of photovoltaic cell, in development as of 2014, was the bulk heterojunction polymer photovoltaic cell. This type of cell included a polymer thin film having an interpenetrating network of a conjugated polymer donor such as poly(3-hexylthiophene-2,5-diyl) (P3HT) and a soluble fullerene acceptor which is typically [6,6]-phenyl-C61-butyric acid methyl ester (PCBM) as the photoactive layer. It has been observed, for this type of cell that the triplet state exitons were far more numerous and longer lasting than singlet state exitons. Accordingly, it was found that creating a weak magnetic field in the thin film had the effect of lowering the short-circuit current by increasing the population of triplet state exitons. W. F. Zhang, Y. Xu, H. T. Wang, C. H. Xu, S. F. Yang, *Sol. Energy Mater. Sol. Cells* 95(2011) 2880.

The experimenters who authored the above noted paper, however, took this result to be intimately tied to the exact nature of bulk heterojunction polymer cells, and they do not ever suggest that the result might be broadly generalizable.

Later, another group of researchers experimented with differing magnetic field strengths applied to dye-sensitized $T_iO_2$ nanoparticle-based photovoltaic cells. Although power conversion efficiency was improved, it does not appear that the mechanism was the same as for the earlier experiment. The improvement in the $J_{sc}$ and g observed in the low magnetic field was attributed to slow electron recombination predominantly caused by the variations of the local electronic surface properties of $T_iO_2$. *Magnetic-field enhanced photovoltaic performance of dye-sensitized $T_iO_2$ nanoparticle-based solar cells* Fengshi Cai, Shixin Zhang, Shuai Zhou, Zhihao Yuan.

Notably, both of these groups experimented and published results regarding photovoltaic cells that were largely made of an organic colloidal suspension or gel. Researchers far more readily view material of this sort from the point of view of chemistry, as this type of material can be probed and sampled fairly easily, thereby permitting an investigator to gather information regarding the internal dynamics of the material.

Further, the vast bulk of photo-voltaic cells in commercial operation are not of the types discussed in the articles. Accordingly, the types of photo-voltaic cells that represent the bulk of the commercial market are left without any benefit from the work of these researchers.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In a first separate aspect, the present invention may take the form of a method of generating electricity from light that uses a photovoltaic array that includes a junction between an inorganic electron-donating layer, and an inorganic electron-accepting layer. The electron-donating layer includes moieties having paired electrons in orbital shells, and wherein some of the electrons are freed from the orbital shells when light strikes the electron-donating layer, thereby transforming the moieties into free radical equivalents but many of the freed electrons recombine back into the orbital shells. Also, many of the free radical equivalents enter a triplet state, and are optimally responsive to an selected magnetic field that has been determined to optimally increase the lifetime of the triplet state and thereby forestall recombination of the freed electrons into the free radical equivalents. A magnetic field of substantially the optimal strength that is substantially unvarying over the electron donating layer is created.

In a second separate aspect, the present invention may take the form of a photovoltaic electric generation assembly includes a photovoltaic array that includes a junction between an inorganic electron-donating layer, and an inorganic electron-accepting layer. The electron-donating layer includes moieties having unpaired electrons in orbital shells, and wherein some of the electrons are freed from the orbital shells when light strikes the electron-donating layer, thereby transforming the moieties into free radical equivalents but many of the freed electrons recombine back into the orbital shells. Also, many of the free radical equivalents enter a triplet state, and are optimally responsive to an optimal magnetic field that has been determined to optimally increase the lifetime of the triplet state and thereby forestall recombination of the freed electrons into the free radicals. Also, a magnetic assembly, exterior to the photovoltaic array creates a magnetic field of the optimal strength that is substantially unvarying over the electron-donating layer.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced drawings. It is intended that the embodiments and figures disclosed herein are to be considered illustrative rather than restrictive.

DETAILED DESCRIPTION OF THE PREFERRED EMBODIMENTS

Many photovoltaic cells function by having an electron-donating layer made of a material. When struck by a photon of correct energy an electron is freed, thereby creating a potential flow of electricity. But the electron and the moiety from which it has been freed are likely to recombine, ending this process. When the electron-donating layer is a solid, the terminology used to describe the phenomenon of the freed electron and the moiety now missing an electron, having its origin in solid state research, is "active electron" and "hole" often referred to as an "exciton." Terminology varies but when an entity is produced that has an unpaired orbital electron and a free electron, the system is the equivalent of a free radical and a freed electron and is termed a "free radical equivalent" herein.

It is possible for a liquid, colloidal suspension or a gel to demonstrate that the "hole" actually displays the same characteristics, in terms of magnetic precession, as a free radical. In fact, what has been termed a "hole" in solid state research is a "free radical" but has simply not heretofore been recognized as such. Accordingly, a magnetic field that acts to forestall the recombination of free radicals with active electrons will increase the quantity of free electrons available for transport and therefore the efficiency of the photovoltaic cell. In particular a magnetic field that maintains free radicals in the triplet state, which greatly reduces the chance of recombination, will increase the number of active electrons and increase the efficiency of the photovoltaic cell.

Each particular material will respond optimally to a magnetic field of optimal strength for maintaining free radicals in the triplet state. Some of the research referenced in the Background section involved the mixing of magnetic particles into a photosensitive layer. This naturally causes a magnetic field that varies with range to the nearest magnetic particle. A magnetic field at the optimal strength that does not vary significantly over the expanse of the electron-donating layer of photosensitive material will yield a greater increase in photovoltaic cell efficiency.

The vast bulk of photo-voltaic cells in operation as of 2014 include an electron-donating layer comprising a silicon based material, such as monocrystalline silicon, polycrystalline silicon (including ribbon silicon) or amorphous silicon. Other materials placed in commercial use, in thin film structures in which the thickness of the electron-donating layer is less than 40 µm and could be as thin as 2 nm, include cadmium telluride (CdTe), copper indium gallium diselenide (CIGS). Amorphous silicon and crystalline silicon is also used in thin film applications.

Figure 1:
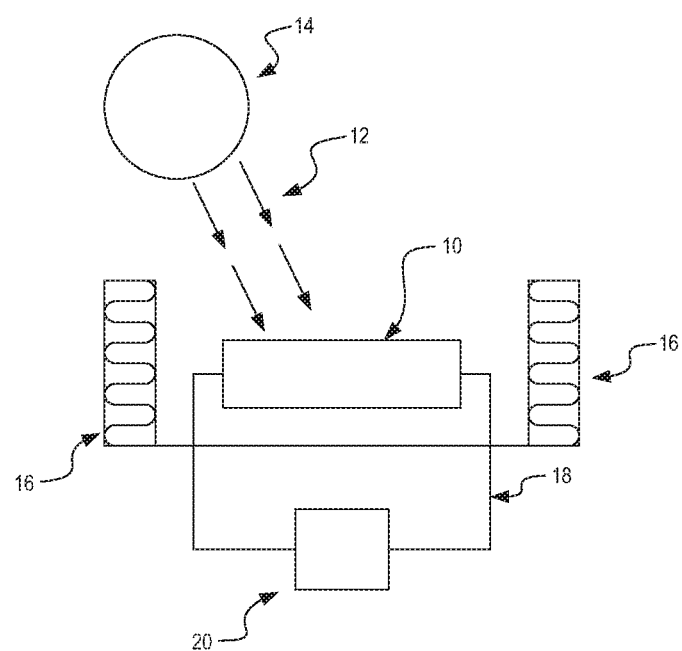
FIG. 1 is a front view of a photovoltaic assembly, according to the present invention.

Referring to FIG. 1, a photovoltaic cell 10, is exposed to photons (light) 12, from the sun 14 and simultaneously exposed to a uniform magnetic field produced by a Helmholtz coil or array of such coils. 16. Electrons produced the photovoltaic cell are connected by an electric circuit 18, to an electric load 20, which may be, more specifically, an electric storage device. In the alternative a balanced arrangement of permanent magnets or a solid layer of such magnets may replace the Helmholtz coils 16, to achieve a similar effect.

Figure 2A:
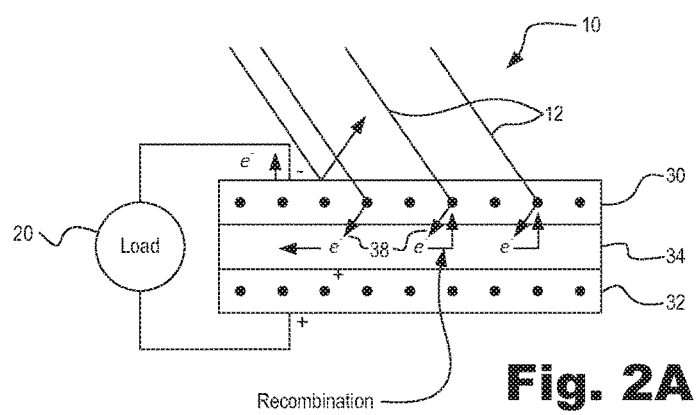
FIG. 2A is an illustration of the operation of a photovoltaic cell, in the absence of magnetic field effects.
Figure 2B:
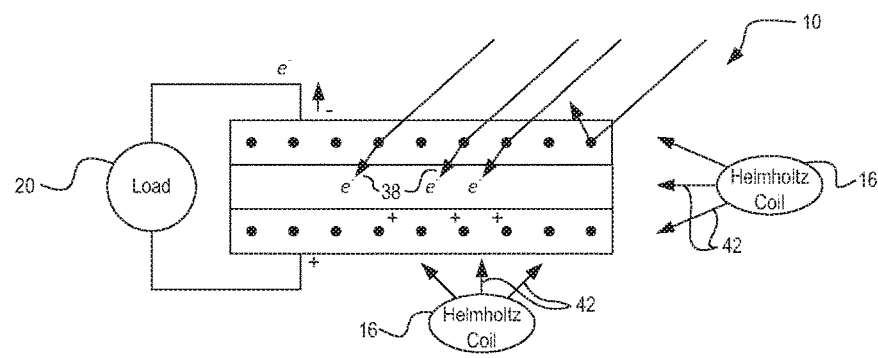
FIG. 2B is an illustration of the operation of a photovoltaic cell, in the presence of magnetic field effects.

FIGS. 2A and 2B illustrate the effect of the magnetic field on the activity of freed electrons. In FIG. 2A, a photovoltaic cell 10 includes an electron-donating layer 30 is joined to an electron-accepting layer 32 by a junction (shown in greatly expanded form) where the process is unaffected by a magnetic field, photons 12 striking the n-type semiconductor free three electrons 38 (as an illustration) into the junction 34. One of these flows to the load 20, thereby forming a part of the current produced by the cell 10. But the other two recombine into the electron-donating layer (shortly after forming), typically into the same moiety from which the particular electron 38 originated. As shown in FIG. 2B, in the same photovoltaic cell the magnetic field 42 (generated from Helmholtz coils 16 shown in completely conceptual form) prevents some of the electrons 38 from recombining back into the moiety from which they came, so they join the flow to the load 20. Skilled persons will understand that this is merely an illustration, and that in reality even with the magnetic field, many electrons recombine into the moiety from which they were ejected. The magnetic field, however, by causing more free radicals to remain in the triplet state, prevents many recombinations, and thereby contributes to the flow of electricity.

Figure 3A:
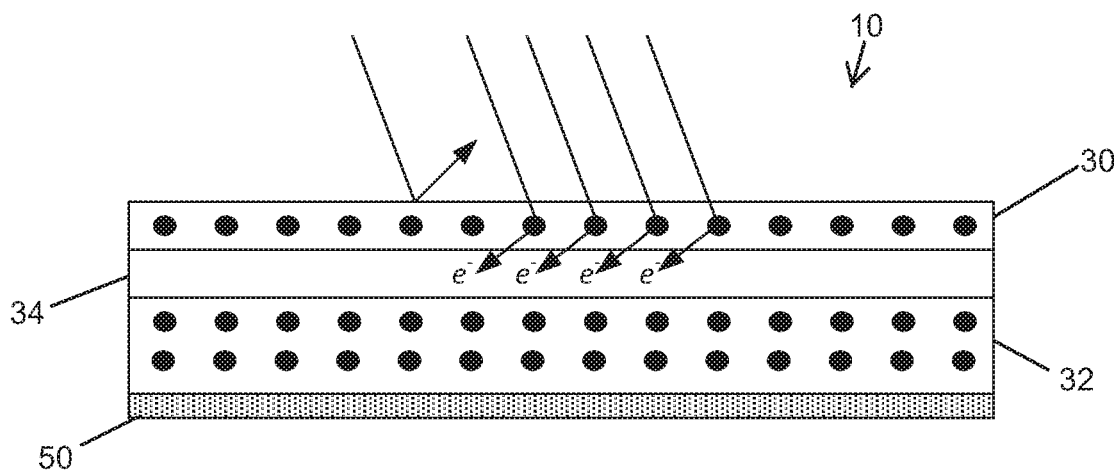
FIG. 3A is an illustration of the operation of a photovoltaic cell assembly, in the presence of magnetic field effects created by a magnetic film, that is part of the assembly.

As shown in FIG. 3A, in an additional preferred embodiment a magnetic paint or film 50 is positioned adjacent to electron-accepting layer 32, and configured to produce a magnetic field of a beneficial magnitude for preventing the recombination of electrons donated by electron-donating layer 30 back into layer 30 after having entered the junction 34. In an alternative preferred embodiment a magnetic film is placed into electron-donating layer 30 with the same object of placing a beneficial magnetic field at junction 34.

Figure 3B:
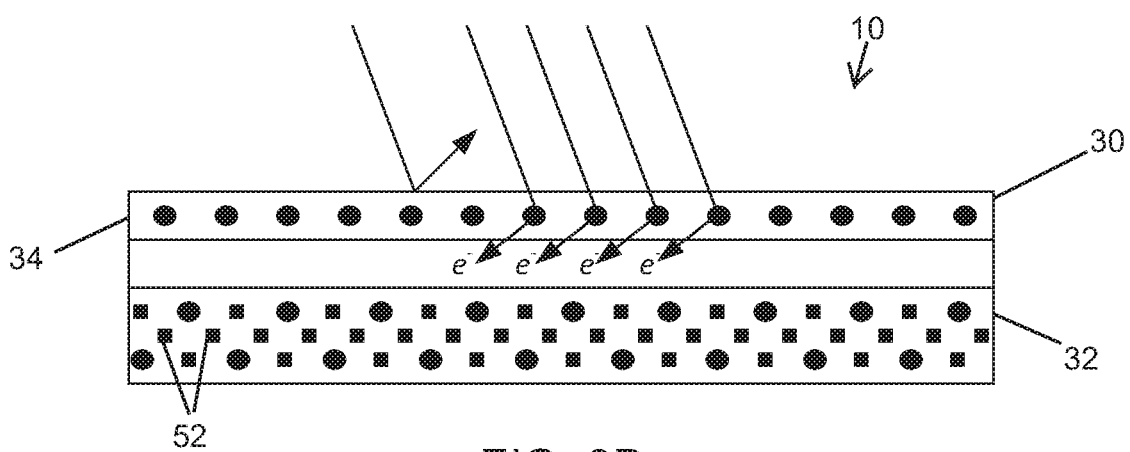
FIG. 3B is an illustration of the operation of a photovoltaic cell assembly, in the presence of magnetic field effects created by magnetic particles mixed into a layer of the cell.

In FIG. 3B magnetic particles 52 are mixed into the electron-accepting layer 32, to create a uniform magnetic field at the junction 34. In one preferred embodiment particles 52 have an average major axis of less than a micrometer. In an alternative preferred embodiment, particles 52 are mixed into the electron-donating layer 30, to place a uniform magnetic field on junction 34. In another alternative, particles 52 are mixed into both electron-accepting layer 32 and electron-donating layer 30.

In one set of embodiments electron-donating layer 30 and electron-accepting layer 34 are both made of similar material, such as crystalline silicon, but where electron donating layer 30 is n-type and electron-accepting layer 34 is p-type. If comprised of crystalline silicon, layers 30 and 34 may be either monocrystalline silicon or polycrystalline silicon. Alternatively layers 30 and 34 are comprised of amorphous silicon or a thin film material such as CdTe or CIGS. In an alternative set of embodiments, the electron-donating layer 30 is comprised of conjugated polymers and the electron-accepting layer 34 is comprised of inorganic nanocrystals. In an alternative preferred embodiment electron-donating layer 30 or electron-accepting layer 32 or both are made of a perovskite.

For each one of the above recited materials, there is a corresponding magnetic field strength that will typically have a value of between 10 and 100 gauss (1 and 10 millitesla) that optimally extends the triplet state lifetimes in free radicals formed in the material.

To determine the optimal magnetic field strength is a fairly easy process, however. A simple experiment may be configured by taking a photovoltaic cell and placing it between two Helmholtz coils, as shown in FIG. 1. A light having known characteristics is then shined upon the photovoltaic cell and various magnetic field strengths are applied, with the resultant electric current produced by the photovoltaic cell measured. In one preferred method a time period wherein no magnetic field is applied is interspersed between the times when a magnetic field is applied, to eliminate the effect of the previous test for magnetic field effect.

While a number of exemplary aspects and embodiments have been discussed above, those possessed of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

The invention claimed is:

1. A method of generating electricity from light, comprising:
    (a) providing a photovoltaic array, including a junction between an inorganic electron-donating layer, and an inorganic electron-accepting layer and a load connected between said inorganic electron donating layer and inorganic electron-accepting layer;
    (b) creating a magnetic field with a field strength between 1 and 10 millitesla, wherein said magnetic field is substantially spatially unvarying over said inorganic electron-donating layer, as said photovoltaic array is being exposed to sun light, the magnetic field preventing some recombinations of free radicals in triplet state, said preventing some recombinations of free radicals in triplet state thereby increasing the efficiency of said photovoltaic array.

2. The method of claim 1, wherein said inorganic electron-donating layer comprises crystalline material.

3. The method of claim 2, wherein said crystalline material, is crystalline silicon.

4. The method of claim 3, wherein said crystalline silicon is polycrystalline silicon.

5. The method of claim 4, wherein said polycrystalline silicon is ribbon silicon.

6. The method of claim 3, wherein said crystalline silicon is monocrystalline silicon.

7. The method of claim 2, wherein said crystalline material is a perovskite material.

8. The method of claim 1, wherein said electron-donating layer comprises amorphous silicon.

9. The method of claim 1, wherein said inorganic electron-accepting layer is comprised of nanocrystals.

10. The method of claim 1, wherein said magnetic assembly comprises two Helmholtz coils, spaced in symmetric fashion about said photovoltaic array.

11. The method of claim 1, further including a step of repeatedly varying an applied magnetic field strength and measuring a resultant current produced by said photovoltaic array, prior to performing the step of paragraph (c), in order to determine said optimal magnetic field strength.

12. The method of claim 1, wherein said magnetic field is created by a magnetic film positioned adjacent to said photovoltaic array.

13. The method of claim 1, wherein said magnetic field is created by particles intermixed with said inorganic electron-donating layer.

14. The method of claim 13, wherein said particles have an average major axis of less than a micrometer.

15. The method of claim 1, wherein said magnetic field is created by particles intermixed with said inorganic electron-accepting layer.

16. A method of generating electricity from light, comprising:
    (a) providing a photovoltaic array, including a junction between an inorganic electron-donating layer, and an inorganic electron-accepting layer and a load connected between said inorganic electron donating layer and inorganic electron-accepting layer;
    (b) creating a magnetic field with a field strength between 1 and 10 millitesla, wherein said magnetic field is substantially spatially unvarying over said inorganic electron-donating layer, as said photovoltaic array is being exposed to sun light, the magnetic field increasing the current produced by said photovoltaic array.

* * * * *